US006775795B2

(12) United States Patent
Doll et al.

(10) Patent No.: US 6,775,795 B2
(45) Date of Patent: Aug. 10, 2004

(54) METHOD AND APPARATUS FOR TESTING AN SDRAM MEMORY USED AS THE MAIN MEMORY IN A PERSONAL COMPUTER

(75) Inventors: Andreas Doll, Neubiberg (DE); Manfred Moser, Dachau (DE); Achim Schramm, München (DE)

(73) Assignee: Infineon Technologies AG, Munich (DE)

( * ) Notice: Subject to any disclaimer, the term of this patent is extended or adjusted under 35 U.S.C. 154(b) by 411 days.

(21) Appl. No.: 09/789,991

(22) Filed: Feb. 20, 2001

(65) Prior Publication Data

US 2001/0025354 A1 Sep. 27, 2001

(30) Foreign Application Priority Data

Feb. 17, 2000  (DE) ......................................... 100 07 177

(51) Int. Cl.[7] .............................................. G11C 29/00
(52) U.S. Cl. ..................... 714/721; 714/42; 714/718; 711/100; 711/118; 365/203
(58) Field of Search ........................... 714/721, 40, 42, 714/718; 365/203; 711/112, 100, 118; 345/592

(56) References Cited

U.S. PATENT DOCUMENTS

| 4,528,636 A | * | 7/1985 | Robinson, III ............... 345/592 |
| 5,673,231 A | * | 9/1997 | Furutani ...................... 365/203 |
| 5,862,320 A | * | 1/1999 | Nelsen et al. .................. 714/42 |
| 5,889,714 A | * | 3/1999 | Schumann et al. ......... 365/203 |
| 6,112,276 A | * | 8/2000 | Hunt et al. .................. 711/112 |
| 6,119,252 A | * | 9/2000 | Roohparvar et al. ........ 714/721 |

OTHER PUBLICATIONS

Messmer, The Indispensable PC Hardware Book, second edition, 1995, Addison–Wesley, Pertinent pp. 9, 52, 53, 73, 221, 222, 392, 394, 395, 1219, 1221 and 1242.*

* cited by examiner

*Primary Examiner*—Albert Decady
*Assistant Examiner*—Dipakkumar Gandhi
(74) *Attorney, Agent, or Firm*—Laurence A. Greenberg; Werner H. Stemer; Ralph E. Locher

(57) ABSTRACT

A method and an apparatus for testing an SDRAM are described. The SDRAM is used as a main memory in the PC, and an additional circuit configuration is accommodated on a plug-in board and has an additional memory in the form of an SRAM and logic circuits. The method according to the invention allows the SDRAM to be tested in a module bank in the running PC to be set deliberately to a test mode. In this case the code for test mode activation is modified by a high-level language program (PASCAL) in accordance with the user requirements, is copied to the additional memory on the plug-in board, and is then called by the high-level language program using MS DOS. After activation of the selected test mode by a code programmed in Assembler, a defined jump is made back to the calling program once again. This allows the use of the test mode provided in the SDRAM in standard PCs and using standard operating systems. This greatly increases the test options for SDRAMs on standard PCs.

8 Claims, 5 Drawing Sheets

METHOD AND APPARATUS FOR TESTING AN SDRAM MEMORY USED AS THE MAIN MEMORY IN A PERSONAL COMPUTER

BACKGROUND OF THE INVENTION

Field of the Invention

The present invention relates to a method and an apparatus for testing an SDRAM memory used as a main memory in a personal computer (PC) and, in particular, is concerned with activation and carrying out predetermined and chip-internal test modes, which are defined in the SDRAM memory by the manufacturer, during normal use of the SDRAM memory as the main memory in a PC.

Various manufacturers integrate specific functions (test modes), which allow the SDRAM to be tested more efficiently in their modules. Until now, these test modes could be activated only by special test equipment, but could not be carried out in the typical SDRAM operational conditions in a computer.

Tests of SDRAMs that led to sporadic failures in the computer were particularly difficult. Sporadic failures such as these cannot be confirmed, or can be confirmed only rarely, on the test equipment.

SUMMARY OF THE INVENTION

It is accordingly an object of the invention to provide a method and an apparatus for testing an SDRAM memory used as the main memory in a personal computer which overcome the above-mentioned disadvantages of the prior art methods and devices of this general type.

With the foregoing and other objects in view there is provided, in accordance with the invention, a method for testing a SDRAM memory used as a main memory in a personal computer (PC) in which manufacturer-defined internal test modes are implemented. The method includes the steps of:

a) storing, in machine code, at least one command sequence suitable for activating and carrying out at least one of the internal test modes, in an additional memory being separate from the main memory;
b) activating the machine code in the PC and switching-off a cache memory of the PC;
c) changing a central processing unit (CPU) in the PC to an UNREAL mode resulting in data segmentation in the main memory being cancelled;
d) setting in the PC, predetermined settings of a PC chip set for an activation sequence of an internal test mode;
e) selecting a desired test mode of the internal test modes available in the SDRAM memory on a user-defined basis and making a read access to the additional memory for carrying out the command sequence for activation of the desired test mode;
f) activating the desired test mode by a specific sequence of commands and addresses being supplied from a memory controller to the SDRAM memory, the specific sequence of commands being controlled by the command sequence stored in the additional memory; and
g) recording test results.

The object of the invention is therefore to specify a method and an apparatus for testing an SDRAM memory used as the main memory in a PC, by activation of at least one test mode implemented in the SDRAM such that the test mode can also be activated and carried out during standard operation of the SDRAM in the computer. In this way, more efficient testing of the SDRAM in its normal application as the main memory in the PC is possible.

The method according to the invention allows all the test modes implemented in the SDRAM to be carried out in a standard PC using standard operating systems. This greatly increases the options for testing SDRAMs on standard PCs. Furthermore, the various test modes implemented in the SDRAM for the first time allow different module-internal parameters, such as voltages and timings, to be varied deliberately, while the SDRAM is operating in the PC, in order to analyze the actual cause of the fault in this normal SDRAM environment in a standard computer.

After carrying out the already activated test mode and recording the test results, the PC chip set settings carried out are cancelled. In addition, the data segmentation in the main memory is reproduced by changing the CPU to the REAL mode, the CACHE memory is switched on again and a jump is made back to the calling program, with the SDRAM memory remaining in the selected test mode, so that its effect is retained in the SDRAM memory. A parameter which has been changed by this effect in the SDRAM memory can then be used to initiate either the normal main memory mode or any desired test software implemented in the PC.

The method according to the invention thus not only allows improved analysis and improved testing of SDRAM modules in their normal environment in the PC, but also allows the configuration of SDRAM chips to be improved. By way of example, it is possible to test different timings with the aid of test modes in the system, in order to use the optimum setting for final configuration of the chip. Thus, by changing parameters within the module, the chip can be optimized to such an extent that optimum operation of the chip in a standard computer is ensured and these settings are then used for final chip design.

One application of the method according to the invention is also to systematically increase or reduce the failure rate of an SDRAM chip in the computer. The behavior of the chip provides information as to how the test programs in the test equipment must be modified in order that failures in the test equipment can also be coped with. The actual fault cause can be further localized and completely analyzed by further variation of internal parameters in the SDRAM module.

The method according to the invention thus provides a new and advantageous tool for analysis of SDRAM modules in their operational environment.

By way of example, one test mode that can be activated using the method according to the invention is a test mode which is referred to as SET-V-REF, which makes it possible to vary the internal reference voltage $V_{ref}$ in an SDRAM chip. The testing can be carried by using standard values of the reference voltage.

A further test mode which can be carried out using the method according to the invention for an SDRAM chip used in a PC is to vary an internal time period, in the SDRAM, between activation of the word line and activation of the associated sense amplifier.

In order to allow the test modes to be activated in the main memory of the PC, that is to say in the SDRAM, the additional memory, which is independent of the main memory, for program running is required in the PC.

An apparatus according to the invention and set up to carry out the method is characterized in that the additional memory is provided with coding logic on a plug-in board. The additional memory is programmed to carry out the steps a)–g) mentioned above. The plug-in board can, for example, be plugged into a plug-in slot for the ISA bus in the PC. Instead of this, the plug-in board may also, for example, be a PCI plug-in board. The sequence for activation of the test modes is thus carried out in machine code using this circuit configuration.

The command sequence stored on the plug-in board can be used deliberately to change the SDRAM, which is located in the module bank in the main memory, in the running PC to one of a number of test modes which can be selected. In this case, the machine code for activation of the test mode is modified by a high-level language program in accordance with user commands which are preset on a user interface, are copied to the additional memory, and are then called by the high-level language program using MS DOS. After activation of the selected test mode by the machine code, a defined jump is made back to the calling program once again.

In accordance with a concomitant feature of the invention, the plug-in circuit board is a 16-bit ISA board and, the additional memory is formed from two 8-bit SRAM modules with an overall data access width of 16 bits.

Other features which are considered as characteristic for the invention are set forth in the appended claims.

Although the invention is illustrated and described herein as embodied in a method and an apparatus for testing an SDRAM memory used as the main memory in a personal computer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
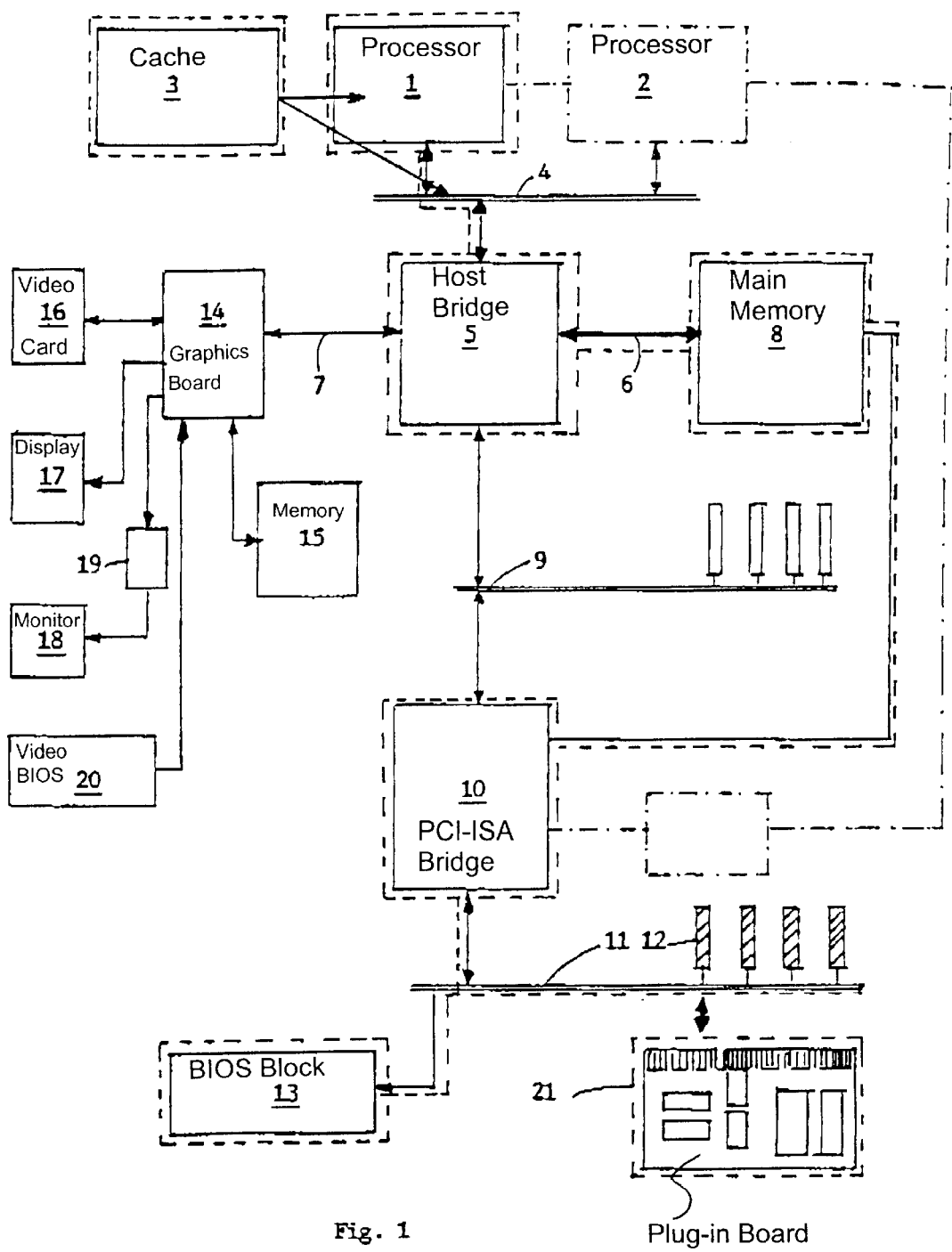
FIG. 1 is a functional block diagram of a commercially available personal computer, in which a method according to the invention can be carried out using an apparatus set up to carry out the method.

In all the figures of the drawing, sub-features and integral parts that correspond to one another bear the same reference symbol in each case. Referring now to the figures of the drawing in detail and first, particularly, to FIG. 1 thereof, there is shown the functional blocks of a personal computer, which will be used for understanding of the invention. Those functional blocks that are essential for the method according to the invention, are surrounded by dashed lines in FIG. 1.

A processor block 1 with an associated CACHE 3 communicates through a HOST bus 4 and a HOST bridge 5 with a main memory 8 which contains SDRAMs to be tested and through a PCI bus 9 with PCI components (not shown) which can be plugged into PCI plug-in slots.

The HOST bridge ("northbridge") 5 is responsible for the calculation of 32-bit addresses in line, column and bank addresses (address multiplex); the control of the SDRAMs by use of control signals CS, RAS, CAS, etc.; the SDRAM operating mode; and a decision as to which module bank to use for a current task.

First, it is clear from these main functions of a PC that the test mode of a SDRAM cannot be activated using an activating code originating from the SDRAM.

In the exemplary embodiment, a circuit configuration is therefore produced on a plug-in board 21 which can be plugged into one of the ISA plug-in slots 12, and which can communicate with the processor 1 and with the main memory 8 through an ISA bus and a PCI-ISA bridge 10, the PCI bus 9, and the HOST bridge 5. The code sequence used for activation of the test mode is buffer-stored on an additional memory 22 that is located on the ISA plug-in board 21. The system BIOS block 13 is also connected to the ISA bus 11.

It should be mentioned that the above description relating to FIG. 1 describes those functional blocks of a commercially available personal computer which are required for understanding of the method steps according to the invention. Further components, such as a parallel processor 2, can be provided but are not necessary for understanding of the invention. Further possible functional blocks are a graphics block 14, linked through an AGP bus 7 to the HOST bridge 5, a graphics memory 15, a video, DVD, camera device, VCR device 16, a display 17, a television monitor 18, a coder 19 and a video BIOS 20.

By using the inserted plug-in board 21 (for example, ISA board with a data access width of 16 bits and which contains two SRAM memory modules as the additional memory 22 and decoder logic modules) the SDRAM in a module bank in a running personal computer can be deliberately changed to a desired test mode. To this end, the machine code for test mode activation is modified by a high-level language program in accordance with the user requirements, is copied to the additional memory 22, and is then called by the high-level language program using MS DOS. After activation of the selected test mode, by the machine code, a defined jump is made back to the calling program once again.

Figure 2:
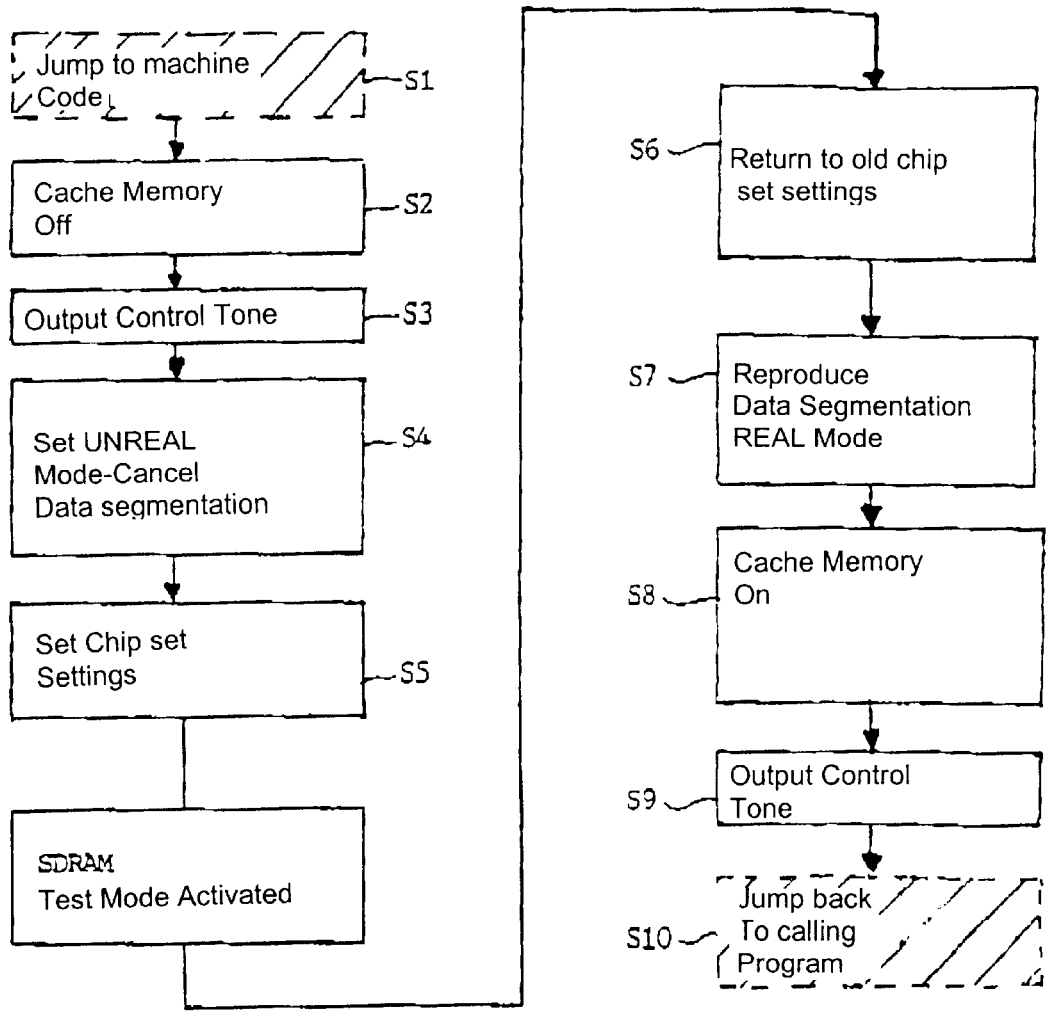
FIG. 2 is a flowchart explaining the method steps that are essential for activation of all the test modes.

The fundamental steps for activation of the SDRAM located in the main memory 8 of the PC will be described in the following text with reference to the flowchart shown in FIG. 2.

First, a jump is made to the machine code (step $S_1$). The CACHE memory 3 is switched off in a second step $S_2$. Then, in step $S_3$ a control tone that indicates the activation of a test mode is output to an acoustic output apparatus (loudspeaker). In step $S_4$, the memory organization form of the PC is temporarily changed to the "UNREAL mode" which is not the normal mode during normal PC operation in order to allow direct access to the entire address area of the main memory, which is then unsegmented.

Furthermore, various settings in the chip set in the PC are varied in an appropriate manner in step $S_5$.

After activation of the test mode and carrying out the SDRAM test, the chip set settings are cancelled once again in step $S_6$. In step $S_7$, the data segmentation is reproduced in the PC memory. This means the REAL mode of the main memory. In step $S_8$, the CACHE memory 3 is switched on again, and a control tone $S_9$ is then produced on the loudspeaker. In step $S_{10}$, a jump is made back to the calling program, with the SDRAM remaining in the selected test mode.

A first example of the SET-V-REF test mode is described in the following text, and further below, a second test mode example for fault analysis by signal development timing is described. The SET-V-REF test mode internally changes the voltage $V_{ref}$ of the SDRAM chip. The voltage $V_{ref}$ is the reference voltage, from which all the other voltages in the chip are derived internally.

The measurement object used is a 64-M SDRAM module, which indicates a number of faults at room temperature as a result of the test using a memory test program. The SDRAM module is now analyzed in the PC by variation of the module-internal voltage $V_{ref}$ at a constant room temperature of 27° C.

The procedure in this case is as follows.

The voltage is raised and lowered with respect to the standard value by activation of the test mode SET-V-REF. After each voltage change, a memory test program was carried out on the SDRAM module, with the number of faults that occurred in the process being documented.

Figure 3:
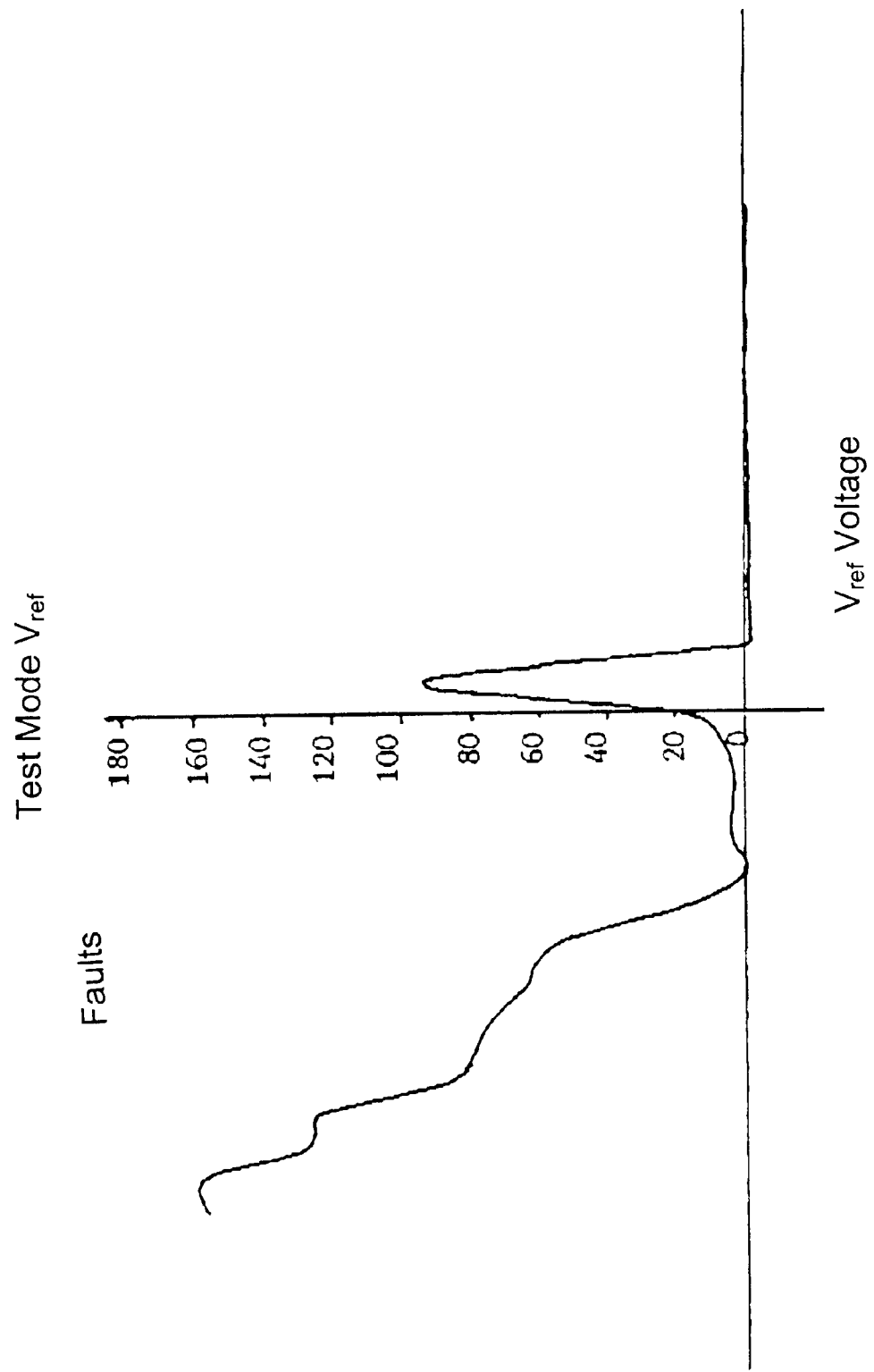
FIG. 3 is a graph showing failure rates of SDRAM modules which were obtained when an internal voltage was varied in a first test mode.

The results of the evaluation are shown in graphical form in FIG. 3. Thus, with this chip, it would be worthwhile increasing the reference voltage $V_{ref}$ by about 50 mV since there would then be no faults whatsoever during use of the SDRAM module. Therefore, from the analysis of the test mode carried out in the PC using the SDRAM module it is indicated that that the memory chip can be improved by a corresponding increase in the reference voltage $V_{ref}$ of 50 mV in the final chip configuration.

Fault analysis by signal development timing will now be described as a second example of the test modes mentioned above.

In order to understand signal development time a brief explanation will first be given as to how the information stored in a SDRAM is read. Binary information (a bit) is stored in the form of a charge in a capacitor that defines a memory cell. When the contents of the memory cell is checked, the activation of a so-called word line opens a selection transistor, which connects the memory cell to a so-called bit line. The charge flows out of the memory cell to the bit line where—depending on the information contained in the cell it produces a positive or negative voltage change. However, the voltage change on the bit line is not sufficient to allow direct further processing using logic gates. A so-called sense amplifier is therefore required to amplify the signal on the bit line and to raise it to the logic level.

The term "Signal Development Time" refers to the time period that passes between activation of the word line and activation of the associated sense amplifier. This time period is critical to the operation of the SDRAM; if it is chosen to be too long, the so-called access time of the SDRAM becomes worse and this limits the maximum operating speed.

If the signal development time is chosen to be too short, there is a risk that the charge in the memory cell does not flow completely onto the bit line by this time, and the sense amplifier, which is activated too early, incorrectly interprets the level on the bit line, thus resulting in incorrect information being read. The signal development time is governed only by internal parameters within the SDRAM chip, and cannot be influenced externally without using the test mode.

Certain faults in the cell array of the SDRAM react particularly sensitively to changes in the signal development time. If, for example, the contact between a memory cell and the bit line has a higher resistance than intended, a longer time period is required to distribute the charge from the memory cell to the bit line. A cell such as this can sporadically lead to faults in standard conditions in the PC.

According to the invention, the signal development time is varied in the second exemplary embodiment, by using the appropriate test mode. A high-resistance bit-line contact can then give a clear response: longer signal development time values reduce the error rate, and shorter values increase it.

Figure 4:
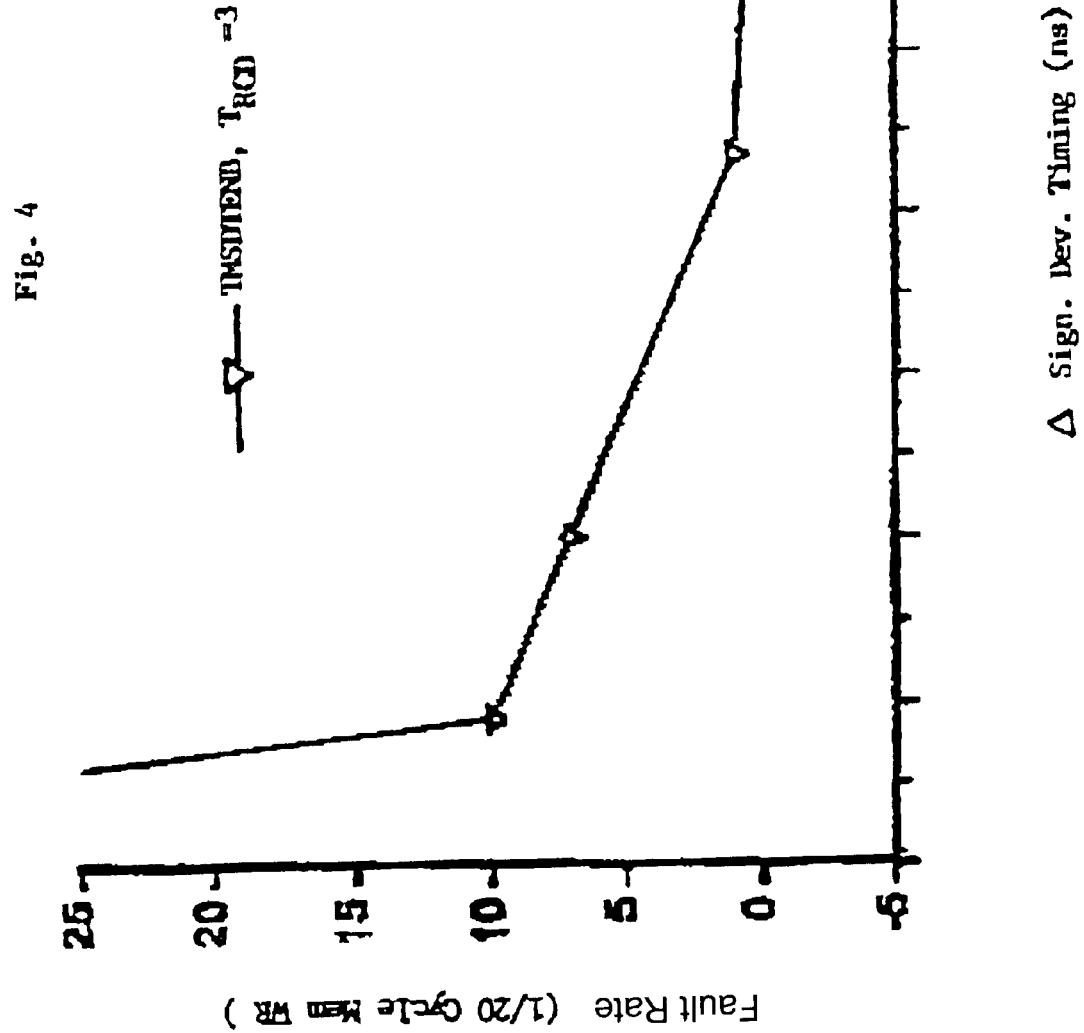
FIG. 4 is a graph showing the failure rates which were found when carrying out a second test mode, in which internal timing of the SDRAM chip is varied according to the method.

The measurement results indicated in graphical form in FIG. 4 show an actual memory failure in the PC, in which case it has been possible to establish the cause of the failure as a high-resistance bit-line contact by activating the appropriate signal development time test mode, with such activation being carried out according to the invention. The curve which represents the measurement results in FIG. 4 makes it clear that, beyond approximately 0.5 ns above the standard value indicated by 0.0, the failure rate determined in the memory test program is approximately equal to zero, and no failures were recorded even for longer system development time values.

Figure 5:
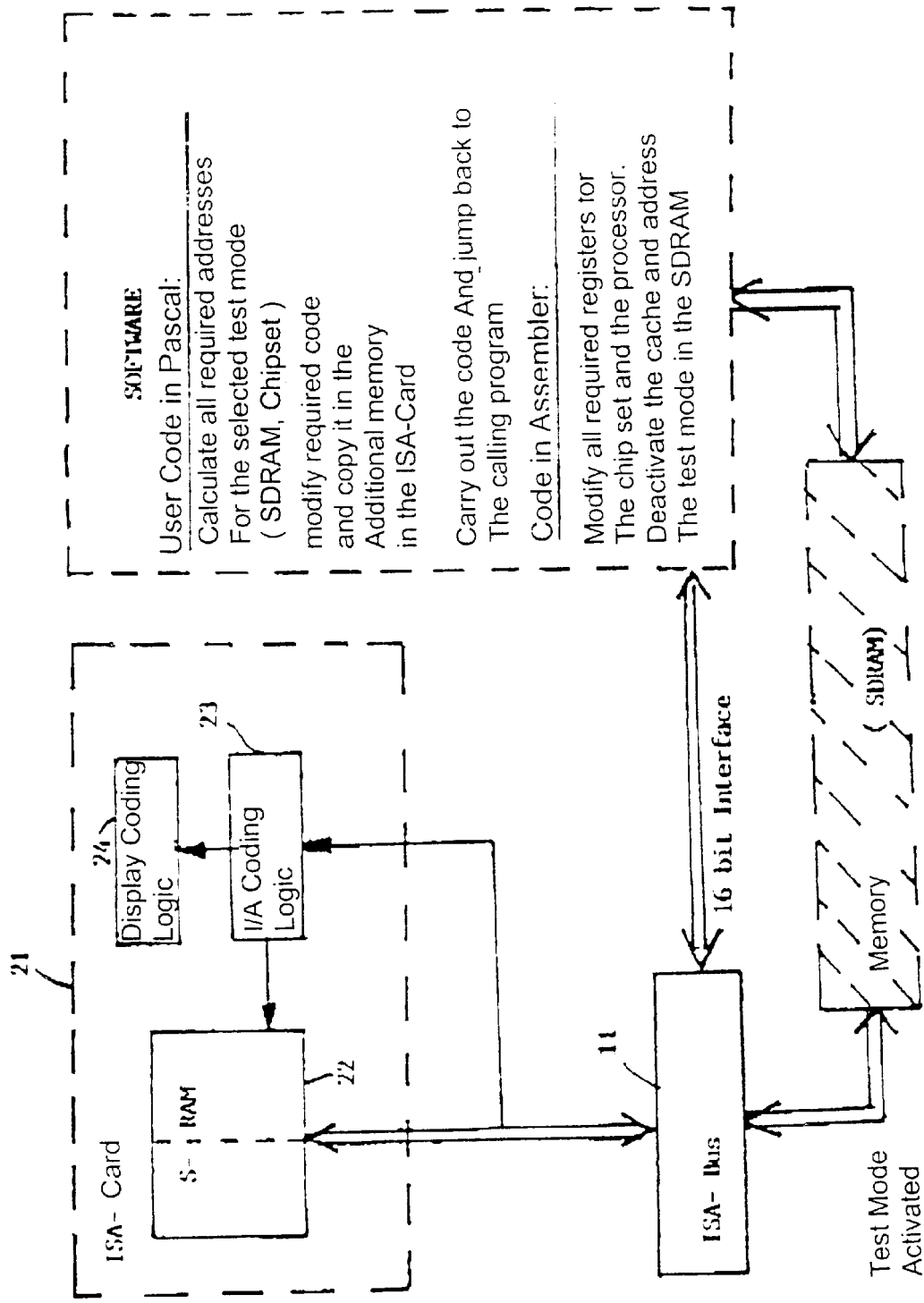
FIG. 5 is a functional block diagram with an ISA plug-in board, having a circuit configuration set up to carry out the method according to the invention.

The block diagram in FIG. 5 combines specific system-related software with the combination proposed for activation of test modes in the main memory 8 of the PC during its normal operation, of a circuit configuration which is provided on a plug-in board 21 and which can be inserted, for example, in the ISA bus plug-in slot 12 (FIG. 1).

The circuit configuration referred to by way of example, on the ISA card 21, has the additional memory 22 (which, for example, contains two 8-bit SRAM modules with an overall data access width of 16 bits), address and I/O output coding logic 23 and display coding logic 24. Those programs that relate to the user interface are programmed, using the high-level language PASCAL, in the block annotated "Software" in FIG. 5. This program code calculates all the addresses required for the selected test mode for SDRAM, chip set, modifies the required code and copies it to the additional memory 22, carries out the code and jumps back to the calling program. The test mode is accordingly called in the high-level language program using MS DOS.

The test mode code is programmed in Assembler. In this Assembler program, all the required registers for the chip set and the processor are modified, the CACHE memory is deactivated, and the SDRAM test mode is addressed.

In FIG. 5, all the new functional blocks required for the method according to the invention are outlined by dashed lines. The main memory 8 (SDRAM) to be tested is shaded using oblique shading lines.

The invention for the first time allows the use of all the test modes implemented in SDRAM chips in standard personal computers and using standard operating systems. Furthermore, these test modes for the first time offer the capability of analyzing the actual cause of a fault by varying various module-internal parameters, such as internal voltages and timings, in the SDRAM used in a normal personal computer. In addition, the fault analysis allows optimizations to be carried out on the SDRAM chip and, furthermore, allows a variation of internal parameters which has been determined to be used for the final configuration of an SDRAM chip.

We claim:

1. A method for testing a SDRAM memory installed as a main memory in a PC and containing manufacturer defined internal test modes that are implementable in the SDRAM memory, the method which comprises the steps of:

a) storing, in machine code, at least one command sequence suitable for activating and carrying out at least one of the internal test modes, in an additional memory being separate from the main memory;

b) activating the machine code in the PC and switching-off a cache memory of the PC;

c) changing a central processing unit (CPU) in the PC to an UNREAL mode resulting in data segmentation in the main memory being cancelled;

d) setting in the PC, predetermined settings of a PC chip set for an activation sequence of an internal test mode;

e) selecting a desired test mode of the internal test modes available in the SDPAM memory for analyzing the SDPAM memory on a user-defined basis and making a read access to the additional memory for carrying out the command sequence for activation of the desired test mode;

f) activating the desired test mode by a specific sequence of commands and addresses being supplied from a memory controller in the PC to the SDRAM memory in the PC, the specific sequence of commands being controlled by the command sequence stored in the additional memory; and g) recording test results by documenting a number of faults occurring while performing the desired test mode.

2. The method according to claim 1, which comprises:

during the storing step a), storing the command sequence for activating an internal test mode for changing an internal voltage of the SDPAM memory; and carrying out and activating the internal test mode for changing the internal voltage during the steps b)–g).

3. The method according claim 2, which comprises carrying out the internal test mode for changing the internal voltage by using a standard value of a reference voltage.

4. The method according to claim 1, which comprises:

during the storing step a), storing the command sequence for activating an internal test mode for changing a chip-internal time period which indicates a time period between activation of a word line and activation of an associated sense amplifier; and activating and carrying out the internal test mode for changing the chip-internal time period during steps b)–g).

5. The method according to claim 1, which comprise a:

reversing the predetermined settings of the PC chip set for the activation sequence of the internal test mode after a recordation of the test results;

reproducing the data segmentation in the main memory by changing the CPU to a REAL mode;

switching-on the cache memory; and jumping back to a calling program, with the SDRAM memory remaining in the desired test mode, so that its effect is retained in the SDRAM memory.

6. The apparatus according to claim 1, wherein the SDRAN memory is a conventional SDRAM memory.

7. An apparatus for testing an SDRAM memory installed and functioning as a main memory in a personal computer (PC), comprising:

a plug-in circuit board for plugging into the PC, said plug-in circuit board having an additional memory programmed to:

a) store, in machine code, at least one command sequence suitable for activating and carrying out at least one of a plurality of internal test modes implemented in the SDRAM memory installed in the PC, in said additional memory being separate from the main memory;

b) activate the machine code in the PC and switch-off a cache memory of the PC;

c) change a central processing unit (CPU) in the PC to an UNREAL mode resulting in data segmentation in the main memory being cancelled;

d) set in the PC, predetermined settings of a PC chip set for an activation sequence of an internal test mode;

e) select a desired test mode of the internal test modes available in the SDRAM memory for analyzing the SDRAM memory on a user-defined basis and a read access being made to the additional memory in order to carry out the command sequence for activation of the desired test mode;

f) activate the desired test mode by a specific sequence of commands and addresses being supplied from a memory controller to the SDRAM memory, the specific sequence commands being controlled by the command sequence stored in the additional memory; and g) record test results by documenting a number of faults occurring while performing the desired test mode.

8. The apparatus according to claim 7, wherein said plug-in circuit board is a 16-bit ISA board and, said additional memory is formed from two 8-bit SRAM modules with an overall data access width of 16 bits.

* * * * *